United States Patent
Crayford

[11] Patent Number: 6,091,348
[45] Date of Patent: Jul. 18, 2000

[54] CIRCUIT AND METHOD FOR ON-THE-FLY BIT DETECTION AND SUBSTITUTION

[75] Inventor: Ian Crayford, San Jose, Calif.

[73] Assignee: Advanced Micro Devices, Inc., Sunnyvale, Calif.

[21] Appl. No.: 08/993,568

[22] Filed: Dec. 18, 1997

[51] Int. Cl.[7] .................................................. H03M 7/00
[52] U.S. Cl. .............................................................. 341/100
[58] Field of Search ................................ 341/58, 59, 100

[56] References Cited

U.S. PATENT DOCUMENTS

| | | |
|---|---|---|
| 4,864,303 | 9/1989 | Ofek ............................................ 341/58 |
| 5,132,572 | 7/1992 | Woo . |
| 5,220,216 | 6/1993 | Woo . |
| 5,227,679 | 7/1993 | Woo . |
| 5,243,625 | 9/1993 | Verbakel et al. . |
| 5,264,745 | 11/1993 | Woo . |
| 5,349,612 | 9/1994 | Guo et al. . |
| 5,363,419 | 11/1994 | Ho . |
| 5,367,542 | 11/1994 | Guo . |
| 5,400,370 | 3/1995 | Guo . |
| 5,425,053 | 6/1995 | Matsumoto . |
| 5,452,333 | 9/1995 | Guo et al. . |
| 5,457,336 | 10/1995 | Fang et al. . |
| 5,457,719 | 10/1995 | Guo et al. . |
| 5,570,089 | 10/1996 | Haas ............................................ 341/58 |
| 5,777,567 | 7/1998 | Murata et al. ............................ 341/100 |
| 5,923,711 | 7/1999 | Wilming . |

*Primary Examiner*—Howard L. Williams

[57] ABSTRACT

A digital delay line, comprising adjustable digital delay elements, receives and buffers an incoming bit stream by repeatedly delaying bits of the bit stream for a specific period of time. The outputs of selected adjustable digital delay elements are tapped for providing a specific pattern of bits in parallel to a function block. The function block operates on the parallel bits on-the-fly to detect and substitute bits for decoding, descrambling, decrypting, or performing any other such function.

17 Claims, 3 Drawing Sheets

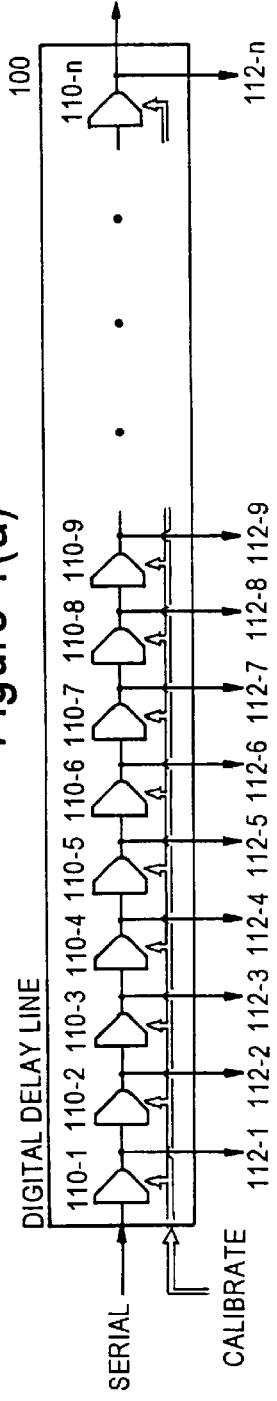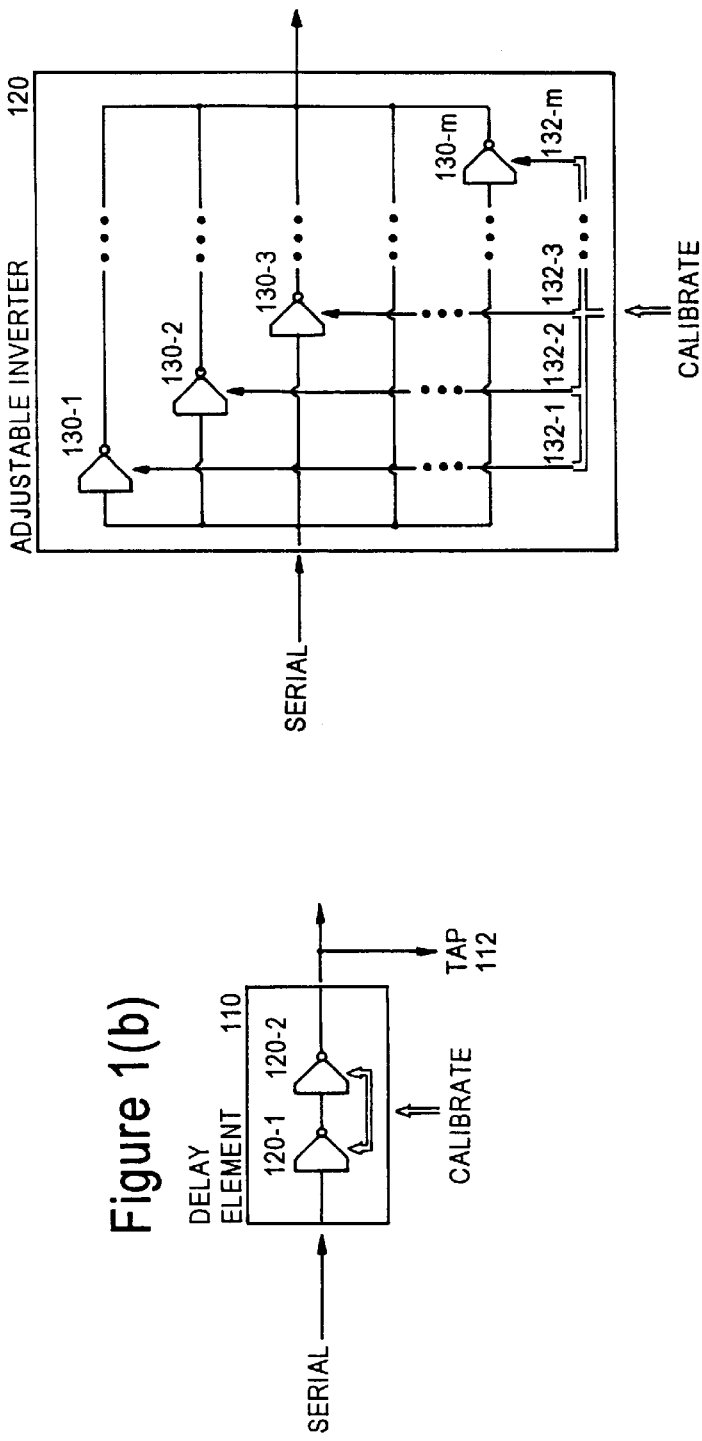

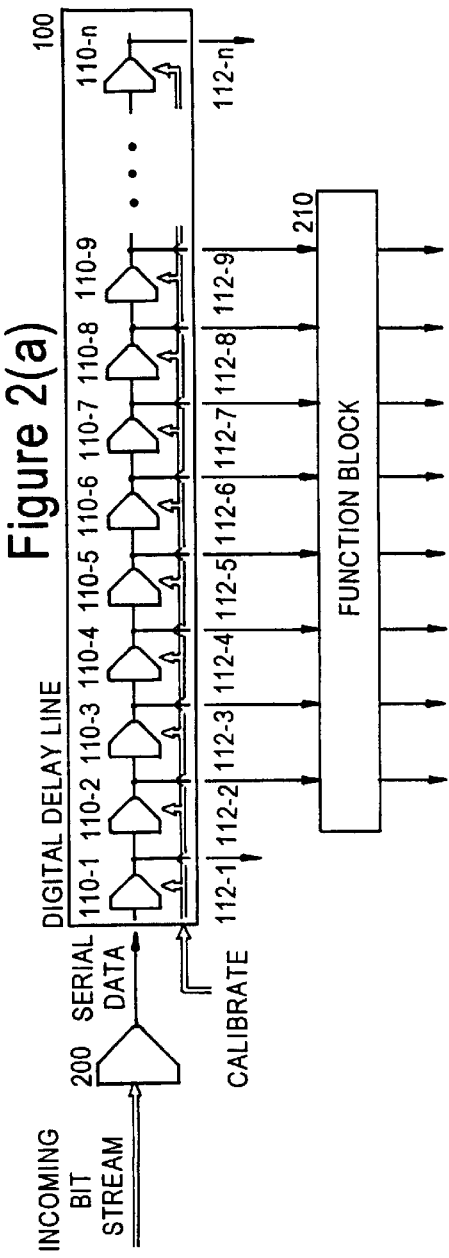
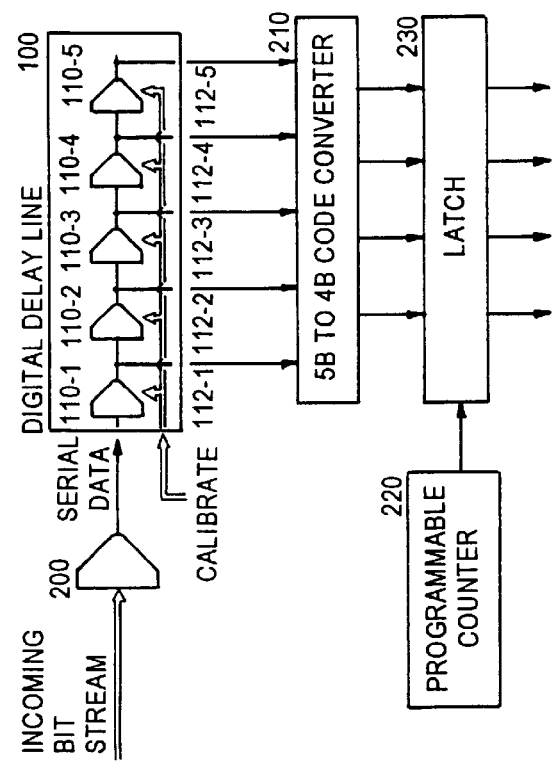

CIRCUIT AND METHOD FOR ON-THE-FLY BIT DETECTION AND SUBSTITUTION

RELATED APPLICATIONS

This application is related to the following commonly assigned applications:

1. "Circuit and Method for High Speed Bit Stream Capture," Ser. No. 08/992449, filed on Dec. 18, 1997 by Ian Crayford.

2. "Circuit and Method for MTL Decoding, Descrambling, and Error Detection," Ser. No. 08/992463, filed Dec. 18, 1997 by Ian Crayford.

TECHNICAL FIELD

The invention relates generally to digital communications and more particularly to decoding serial bit streams in a communications system.

BACKGROUND ART

In serial based communication systems, data is transmitted serially between network nodes in a bit stream, comprising a sequences of separate bits, evenly spaced by a bit period. The speed at which a node can process a bit stream in order to operate upon the information contained therein is determined by, among other factors, the data rate of the bit stream and the bit stream processing latency. The data rate of a bit stream is the inverse of the bit period, and the bit stream processing latency is the delay from the time the bit stream arrives at the node to the time the individual bits are available for computation.

In many cases, a bit stream may be formatted to improve various aspects of transmission. For instance, a bit stream may be encoded via an mBnB block code for reducing baseline wander problems by eliminating long strings of 1s and 0s in a serial transmission. Another approach for eliminating long sequences of the same bit is to scramble the serial data with a known polynomial. A different form of scrambling is encryption of a bit stream to improve the security of the transmission of data.

In many such cases, bits of an incoming bit stream must be detected and substituted before the information in the bit stream can be used by a user application. For example, one FDDI standard for fiber-optic networks specifies that transmitted bits are encoded with a 4B5B block code. Consequently, a receiving node of the fiber-optic network must detect every five bits and substitute the five bits with a corresponding four-bit value.

In conventional systems, the data rate of such formatted incoming bit streams is limited for a variety of reasons. For example, the incoming bit stream is usually stored for processing in a random access memory (RAM) buffer, such as a dynamic RAM (DRAM) buffer and static RAM (SRAM) buffer. Thus, the data rate of a bit stream can be limited by the speed of these memories.

Furthermore, the entire bit stream is typically stored in the RAM buffer, before bits of the bit stream may be operated upon. Accordingly, the processing latency depends on the size of the incoming bit stream and the rate at which the bit stream can be handled.

As another example, processor intervention may be required to handle the incoming bit stream. The speed of the processor, therefore, can further limit the data rate of the bit stream. Processors can also be relatively costly and require substantial additional hardware and software resources for functions unnecessary to detecting and substituting bits in a bit stream. If, however, a processor already dedicated for another task is shared, then processing the bit stream reduces the performance of the shared processor.

DISCLOSURE OF THE INVENTION

There exists a need for a circuit and method that can process high-speed data transmissions of bit streams.

There exists a need for a circuit and method that can detect and substitute bits of a bit stream without storing the bits of the bit stream into a RAM buffer.

There exists a need for a circuit and method that can detect and substitute bits of a bit stream without storing the entire bit stream into a RAM buffer.

There exists a need for a circuit and method that can detect and substitute bits of a bit stream without processor intervention.

There exists a need for a circuit and method that can perform a 4B5B decoding of a bit stream without storing the bits of the bit stream into a RAM buffer.

There exists a need for a circuit and method that can perform a 4B5B decoding of a bit stream without storing the entire bit stream into a RAM buffer.

There exists a need for a circuit and method that can perform a 4B5B decoding of a bit stream without processor intervention.

These and other needs are met by the present invention, in which a bit stream is buffered in a high-speed, digital delay line. This digital delay line is tapped at various points for outputting specified bits of the bit stream in parallel. These specified bits are operated upon for on-the-fly detection and substitution, so that any pattern of bits at any offset from the start of the bit stream may be operated upon before the entire bit stream is received.

According to one aspect of the present invention, an on-the-fly bit stream detection and substitution circuit comprises a digital delay line for receiving and delaying a bit stream. The digital delay line includes digital delay elements and taps. Each digital delay element is coupled in series, and each tap is coupled to an output of a respective digital delay element. The circuit also comprises a function block having a plurality of block inputs coupled to the taps. The function block receives a first set of bits in parallel, applies a function to the first set of bits to produce a second set of bits, and outputs the second set of bits.

Using a digital delay line enables the bit stream to be buffered at a high-speed without RAM or processor intervention. Further, the digital delay line enables bits of the bit stream to be simultaneously available to the function block for detection and substitution before the bit stream has been fully received.

According to another aspect of the invention, an on-the-fly 4B5B decoder circuit comprises a transmission interface unit, which receives an incoming bit stream and produces a received bit stream from the incoming bit stream. The on-the-fly decoder circuit includes a digital delay line with five digital delay elements coupled in series and five taps, each tap coupled to the output of a respective digital delay element. A 5B-to-4B converter circuit has five block inputs, coupled to a respective tap of the five taps, and four block outputs. A latch has four latch inputs, coupled to a respective block output, and a latch control input for latching four bits at the four latch inputs in response to a latch control signal. A counter counts five bit stream periods of the received bit stream and, when the five bit stream periods are counted, generates the latch control signal.

Using a digital delay line enables the bit stream to be buffered at a high-speed without RAM or processor intervention. Further, the digital delay line enables bits of the bit stream to be simultaneously available to the 5B-to-4B decoder before the bit stream has been fully received.

Another aspect of the present invention is a method of detecting and substituting bits in a high-speed bit stream. The method comprises the step of repeatedly delaying, for a bit period, bits from the high-speed bit stream. These bits are tapped to produce a first set of bits in parallel. The method includes applying a function to the first set of bits in parallel to produce a second set of bits. Repeatedly delaying bits of the bit stream enables the bit stream to be buffered at a high-speed without RAM or processor intervention. Further, tapping these bits enables them to be simultaneously available for detection and substitution before all of the bit stream has been received.

Additional objects, advantages, and novel features of the present invention will be set forth in part in the detailed description which follows, and in part will become apparent upon examination or may be learned by practice of the invention. The objects and advantages of the invention may be realized and obtained by means of the instrumentalities and combinations particularly pointed out in the appended claims.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIG. 1(a) is a block diagram of a digital delay line according to an embodiment.

FIG. 1(b) is a block diagram of an adjustable delay element according to an embodiment.

FIG. 1(c) is a block diagram of an adjustable inverter according to an embodiment.

FIG. 2(a) is a block diagram of an on-the-fly bit detection and substitution circuit according to an embodiment.

FIG. 2(b) is a block diagram of an on-the-fly 5B-to-4B decoding circuit according to another embodiment.

BEST MODE FOR CARRYING OUT THE INVENTION

Figure 3B:
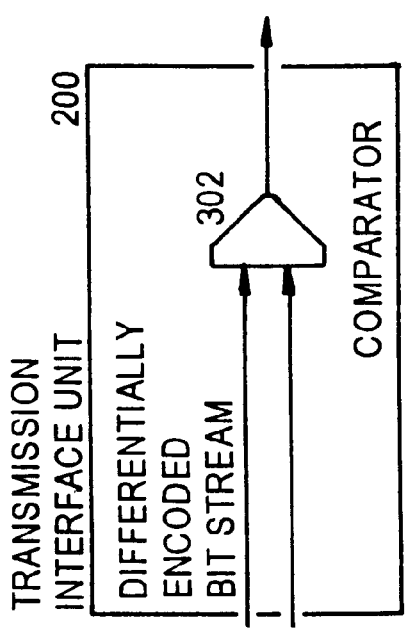
FIGS. 3(a) and 3(b) depict a transmission interface unit according to two embodiments.

A circuit and method for on-the-fly bit detection and substitution for a bit stream are described. In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

High-speed Digital Delay Line

FIG. 1 is a block diagram of an exemplary high-speed, digital delay line 100 with which the present invention can be implemented. The exemplary high-speed digital delay line 100 receives a serial bit stream comprising a plurality of bits spaced at a regular interval, the "bit stream clock period." Digital delay line 100 delays the serial bit stream so that an identical serial bit stream is output but with a phase delay of an integral number of bit stream clock periods.

Specifically, digital delay line 100 comprises a plurality of digital delay elements 110-1 to 110-n, coupled in series. Each of the digital delay elements 110-1 to 110-n delays a digital signal for a specified amount of time. Digital delay line 100 may comprise an arbitrary number n of digital delay elements, depending upon any constraints inherent in the semiconductor implementation utilized or other practical considerations. For example, digital delay line 100 can comprise tens of thousands of digital delay elements. Since each of the digital delay elements 110-1 to 110-n of digital delay line 100 is constructed during the same manufacturing process on the same semiconductor substrate, it is likely that the operating characteristics, hence the delay period, of each digital delay element are nearly identical.

When the common delay period equals the bit stream clock period, each individual bit of the serial bit stream input into digital delay line 100 is being delayed by a distinct digital delay element. Thus, outputs of a plurality of digital delay elements may be tapped to simultaneously view a plurality of bits of the serial bit stream. Accordingly, digital delay line 100 comprises a plurality of taps 112-1 to 112-n coupled to the outputs of the respective digital delay elements 110-1 to 110-n for viewing portions of the serial bit stream in parallel.

The delay characteristics of any digital circuit will vary from chip to chip and over time because of unavoidable variations in manufacturing and operating conditions. Thus, there is a need to calibrate the delay period of each of the digital delay elements 110-1 to 110-n to match the bit stream clock period. According to one approach, both the delay period and the bit stream clock period are synchronized to a reliable, precise reference clock, such as a crystal oscillator.

The delay period of each of the digital delay elements 110-1 to 110-n is preferably adjustable by a digital command code as a calibration signal. This calibration signal is produced with reference to a reliable, precise clock signal, preferably by an on-chip digital servo circuit (not shown) such as described in the commonly assigned U.S. Pat. No. 5,457,719, issued to Guo et al. on Oct. 10, 1995. Briefly, the on-chip digital servo circuit comprises an adjustable digital delay line of its own, which it monitors and continually adjusts with a calibration signal in a feedback loop. The calibration signal is shared with other systems on the chip.

Referring to FIG. 1(b), each adjustable digital delay element 110 comprises two adjustable inverters 120-1 and 120-2, coupled in series, each receiving the aforementioned calibration signal. Thus, the delay period of each of the two adjustable inverters 120-1 and 120-2 is one-half of the bit stream clock period and is controlled by the calibration signal.

Referring to FIG. 1(c), each adjustable inverter 120 in a preferred embodiment comprises a plurality of switchable inverters 130-1 to 130-m coupled in parallel. Each of the switchable inverters 130-1 to 130-m is switched on or off by a bit of the calibration signal. Thus, two of the parameters that determine the propagation delay of an inverter, the P-channel size to N-channel size ratio and the driving power, may be determined for precise control over the delay period. Switchable inverters are described in further detail in the commonly assigned U.S. Pat. No. 5,220,216, issued to Woo on Jun. 15, 1993, and the commonly assigned U.S. Pat. No. 5,227,679, issued to Woo on Jul. 13, 1993.

Accordingly, digital delay line 100 comprises a series of adjustable digital delay elements 110-1 to 110-n, each of which provides a uniform delay period synchronized to a reference clock period according to a calibration signal. Moreover, each adjustable inverter 120 can have a consistent delay period of as little as 70 ps. Thus, each adjustable digital delay element 110 can have a consistent delay period of as little of 140 ps. Therefore, digital delay line 100 is high-speed, capable of processing a serial bit stream at data rates up to about 7 GHz. Furthermore, digital delay line 100 provides parallel taps 112-1 to 112-n for simultaneously viewing in parallel any portion of a high-speed serial bit stream.

On-the-fly Bit Detection and Substitution

FIG. 2(a) is a block diagram of an on-the-fly bit detection and substitution circuit. An incoming bit stream is received by a transmission interface unit 200 and processed to be a signal suitable for driving CMOS circuitry, e.g. digital delay line 100. In one embodiment, shown in FIG. 3(a) the transmission interface unit 200 comprises a buffer/level shifter 300 which receives a single ended bit stream, such as a TTL or CMOS signal, and adjusts the driving power and voltage to produce a bit stream that can drive CMOS circuitry.

Figure 3A:
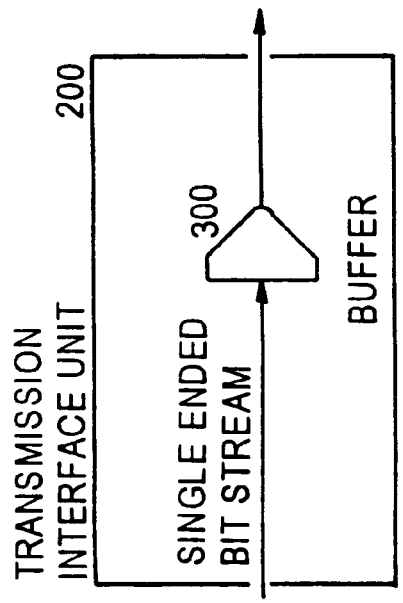

In another embodiment, shown in FIG. 3(b), the transmission interface unit 200 comprises a comparator 302 for receiving a differentially encoded bit stream, such as an ECL signal, and producing therefrom a single ended bit stream suitable for driving CMOS. One example of an ECL-to-CMOS comparator that may be used to implement an embodiment of the present invention is disclosed in the commonly assigned U.S. Pat. No. 5,264,745, issued to Woo on Nov. 23, 1993.

The bit stream output from transmission interface unit 200 is applied to digital delay line 100, wherein each of the digital delay elements 110-1 to 110-n is calibrated to delay a bit of the bit stream for an interval equal to the bit period. In this manner, each received bit of the bit stream (up to a maximum of n bits) is found at an output of a digital delay element 110. Accordingly, any set of outputs of digital delay elements 110-1 to 110-n may be tapped to provide parallel data.

Function block 210 comprises a plurality of block inputs which are coupled to some of the taps. A tap may be coupled to more than one block input. Although the figure shows taps 112-2 to 112-9 being coupled to function block 120, the number and location of these taps 112-1 to 112-9 is strictly for purposes of illustration. There is no requirement that these particular taps 112-1 to 112-9 be coupled to function block 120 nor even be consecutive. In fact, it is contemplated that any number of taps 112-1 to 112-n from any part of the digital delay line 110 may be coupled to function block 210 in any sequence, depending on the requirements of the particular environment in which the present invention is implemented.

In this manner, serial data in a bit stream is received and buffered within a digital delay line 100. Buffered data within the digital delay line 100 is made available on-the-fly in a parallel format for bit detection and substitution by a function block 210. Function block 210 can implement a variety of bit detection and substitutions functions, such as applying a transfer function (e.g., digital filtering), performing a complex symbol decode (e.g., 4B5B decoding), decompression, decryption, descrambling, authentication, bit stripping and replacement, error checking, and so forth.

The parallel data can be operated upon as soon as all the constituent bits are received. Accordingly, the processing latency is not dependent on the length of the entire bit stream but on a shorter amount of time to receive all the constituent bits. As mentioned above, the delay of the individual delay elements 110-1 to 110-n can be as little as 140 ps, which enables bits streams having a data rate up to 7 GHz to be processed without using a RAM or processor intervention to buffer the bit stream.

On-the-fly 5B to 4B Decoding

According to one embodiment of the present invention, depicted in FIG. 2(b), an incoming bit stream, encoded using a 4B5B block code common in FDDI and 100BASE-T networks, is decoded on-the-fly. A 4B5B block code encodes every four bits of a bit stream into five bits, chosen in order to reduce runs of consecutive 1s and 0s and thus prevent baseline wander problems.

Accordingly, function block 210 of FIG. 2(a) comprises a 5B-to-4B converter 210, which converts the five-bit 4B5B codes into the corresponding four-bit values. Those skilled in the art will readily recognize that the actual conversion logic can be implemented in a variety of ways including combinational logic and programmable arrays of logic (PALs).

The output of the 5B-to-4B converter 210 is coupled to latch inputs of a latch 230, which is controlled by a latch control signal generated by programmable counter 220.

Programmable counter 220 is configured for counting the number of bit periods in the bit stream from the start of the bit stream. When the programmable counter 220 reaches a prescribed number, the latch control signal is generated. The programmable counter 220 may receive an input that determines what the prescribed number is and an input that resets the count, which allows the programmable counter 220 to conditionally produce a plurality of latch control signals during the reception of the bit stream. In the case of 4B5B block code decoding, programmable counter 220 is configured for generating a latch control signal after counting every five bit periods.

Latch 230 comprises a plurality of latch inputs which are coupled to the block outputs of function block 210, in this case to the four block outputs of 5B-to-4B converter 210. Thus, when latch 230 receives the latch control signal, the data present on the latch inputs is latched and output at the latch outputs until the next time a latch control signal is received. In this manner, every five bits is detected and substituted on-the-fly with a corresponding pattern of four bits.

Other applications of the present invention include decompression, descrambling, and decrypting. Sometimes data is compressed before transmission to reduce the length of the bit stream. Accordingly, an application of the present invention has a function block 210 comprising decompression circuitry for on-the-fly decompression.

Sometimes the transmitted data is scrambled by applying a known polynomial in order to reduce the length of consecutive bits of the same value. Thus, another application of the invention has a function block 210 comprising descrambling circuitry for on-the-fly descrambling. In yet another application, function block 210 comprises decryption circuitry for implementing more secure communications. In other applications these circuits are chained together.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. An on-the-fly bit stream detection and substitution circuit, comprising:
    a transmission interface unit for receiving an incoming bit stream and producing therefrom a received bit stream;
    a digital delay line, including a plurality of digital delay elements coupled in series and a plurality of taps, each tap coupled to the output of a respective digital delay element of said plurality of digital delay elements, for receiving and delaying said received bit stream; and
    a combinational logic function block having a plurality of block inputs, each block input being directly coupled to a respective tap of said plurality of taps for receiving in parallel a plurality of bits from said received bit stream, applying a function to said plurality of bits to produce a second plurality of bits, and outputting said second plurality of bits through a plurality of block outputs.

2. The circuit of claim 1, wherein said transmission interface unit includes a buffer for receiving a single ended bit stream and producing therefrom said received bit stream applied to said digital delay line.

3. The circuit of claim 2, wherein said transmission interface unit includes a level shifter for shifting the voltage level of said single ended bit stream.

4. The circuit of claim 1, wherein said transmission interface unit includes a comparator for comparing a differentially encoded bit stream and producing therefrom said received bit stream applied to said digital delay line.

5. The circuit of claim 1, wherein:
    said digital delay line further includes a calibration input for receiving a calibration signal; and
    each of said plurality of digital delay elements comprises a calibration input for receiving said calibration signal for adjusting the delay period thereof.

6. The circuit of claim 5, wherein each digital delay element comprises:
    a first adjustable inverter, having a first calibration input for receiving said calibration signal; and
    a second adjustable inverter, coupled in series to said first switchable inverter, having a second calibration input for receiving said calibration signal.

7. The circuit of claim 1, wherein the delay period of each of said plurality of digital delay elements are the same.

8. The circuit of claim 1, wherein the delay period of each of said plurality of digital delay elements is at least 140 ps.

9. An on-the-fly 4B5B decoder circuit, comprising:
    a transmission interface unit for receiving an incoming bit stream and producing therefrom a received bit stream;
    a digital delay line, including five digital delay elements coupled in series and five taps, each tap coupled to the output of a respective digital delay element of said five digital delay elements, for receiving and delaying said received bit stream; and
    a combinational logic 5B-to-4B converter circuit having five block inputs directly coupled to a respective tap of said five taps and four block outputs;
    a latch having four latch inputs, coupled to a respective block output of said four block outputs, and a latch control input for receiving a latch control signal for latching four bits at said four latch inputs; and
    a counter for counting five bit stream periods of said received bit stream and, when said five bit stream periods are counted, generating said latch control signal.

10. A method of on-the-fly bit detection and substitution of a bit stream, comprising the steps of:
    repeatedly delaying by a delay period a plurality of bits from said bit stream;
    tapping said plurality of bits in parallel; and
    applying a function in a combinational logic function block without latching the tapped plurality of bits to said tapped plurality of bits to produce a second plurality of bits.

11. The method of claim 10, further comprising the step of level shifting said bit stream.

12. The method of claim 10, further comprising the step of comparing a differentially encoded voltages of said bit stream.

13. The method of claim 10, further comprising the step of calibrating said delay period to be the same as the bit stream period for said bit stream.

14. The method of claim 10, further comprising the steps of:
    counting a prescribed number of bit stream periods for said bit stream; and
    latching said second plurality of bits when said prescribed number of bit stream periods is counted.

15. The method of claim 14, further comprising the step of changing said prescribed number.

16. The method of claim 14, wherein said second plurality of bits is latched before all of said bit stream is delayed.

17. The method of claim 14, wherein:
    the step of applying a function includes the step of performing a 5B to 4B conversion; and
    the step of counting a prescribed number of bit stream periods includes the step of counting five bit stream periods.

* * * * *